United States Patent
Norimatsu et al.

(10) Patent No.: US 8,044,719 B2
(45) Date of Patent: Oct. 25, 2011

(54) CLASS D AMPLIFIER CIRCUIT

(75) Inventors: Takashi Norimatsu, Hamamatsu (JP); Morito Morishima, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 56 days.

(21) Appl. No.: 12/661,089

(22) Filed: Mar. 10, 2010

(65) Prior Publication Data

US 2010/0231298 A1 Sep. 16, 2010

(30) Foreign Application Priority Data

Mar. 11, 2009 (JP) ................................. 2009-058605

(51) Int. Cl.
*H03F 3/217* (2006.01)
(52) U.S. Cl. .................................... 330/251; 330/207 A
(58) Field of Classification Search .................... 330/10, 330/207 A, 251
See application file for complete search history.

(56) References Cited

U.S. PATENT DOCUMENTS 5,610,553 A * 3/1997 Kirn ................................. 330/10
2010/0090764 A1 * 4/2010 Buter et al. ................... 330/251

FOREIGN PATENT DOCUMENTS

| JP | 2006217106 | 8/2006 |
|---|---|---|
| JP | A-2007-325236 | 12/2007 |

OTHER PUBLICATIONS

Korean Intellectual Property Office "Notice of Submission of Argument" dated Apr. 25, 2011, Application No. 10-2010-0020793, 3 pages.

* cited by examiner

*Primary Examiner* — Khanh Nguyen
(74) *Attorney, Agent, or Firm* — Pillsbury Winthrop Shaw Pittman LLP

(57) ABSTRACT

A class D amplifier circuit for generating a pulse signal whose pulse width is modulated in response to an input signal, the class D amplifier circuit includes first to fifth switching elements, a first capacitance element and a control section. The control section controls transition between a conduction state and a non-conduction state of each of the first to fifth switching elements to control a current direction flowing into a load having a first end electrically connected to the output end and a second end set to the reference potential, so that the current flows from the first end of the load to the second end of the load at a first timing and the current flows from the second end of the load to the first end of the load at a second timing.

6 Claims, 14 Drawing Sheets

CHARGING

NEGATIVE POWER SUPPLY CHARGING

POSITIVE OUTPUT STANDBY

POSITIVE OUTPUT

NEGATIVE OUTPUT STANDBY

NEGATIVE OUTPUT

CLASS D AMPLIFIER CIRCUIT

BACKGROUND

This invention relates to a class D amplifier circuit.

A class D amplifier circuit converts an input signal into a pulse width modulation signal of constant amplitude and amplifies power, for example, the class D amplifier circuit is used for power amplification of an audio signal. The class D amplifier circuit operates in binary and thus can drastically lessen the loss of a transistor. Further, the class D amplifier circuit has the advantage that it has higher efficiency than a linear amplifier regardless of whether the amplitude of an input signal is large or small.

The class D amplifier circuit includes, for example, an integration circuit for integrating input signals, a comparison circuit for making a comparison between an output signal of the integration circuit and a predetermined triangular wave signal, and a pulse width amplifier for outputting a pulse width modulation signal pulse-width-modulated based on the comparison circuit. The output signal of the pulse width amplifier is fed back into the input of the integration circuit. The output signal of the pulse width amplifier passes through a low-pass filter made up of a coil, a capacitor, and the like and becomes an analog signal for driving a load of a loudspeaker, etc.

As the class D amplifier circuits, for example, those as disclosed in Patent Document 1 and Non-patent Document 1 are known.

[Patent Document 1] JP-A-2006-217106

[Non-patent Document 1] "Designing and Manufacturing of Class D/Digital amplifier" written and edited by Jun HONDA, CQ Publishing CO., ltd, 2004, p 51-

By the way, such a class D amplifier circuit as described above involves various problems to be solved or considered as described below:

For example, in a half bridge class D amplifier circuit as disclosed in Patent Document 1, it becomes necessary to install a capacitor of a comparatively large capacitance to prevent a DC current from flowing into a load (refer to [FIG. 1] or "AC coupling capacitor" in [Claim 1], etc., of Patent Document 1). Installing the capacitor could be a large hindrance to miniaturization of the whole device, etc. Therefore, preferably, installing the capacitor is circumvented; to realize circumventing of installing the capacitor, for example, a method of supplying positive and negative two power supply potentials to a half bridge circuit is available. However, a new disadvantage in that two power supplies must be provided occurs.

To use a full bridge class D amplifier circuit rather than the half bridge circuit, the problems described above can be suitably solved because a differential signal is given to the full bridge circuit. (For the configuration, refer to p 50, [FIGS. 3-7], etc., of Non-patent Document 1.) That is, a capacitor to prevent a DC current from flowing into a load is not required and positive and negative two power supplies need not be provided. In this case, however, there also occurs a problem in that the D amplifier circuit cannot be applied to a load requiring a ground criterion (for example, stereo headphone, stereo earphone, etc.,) if it is assumed that a unipolar power supply is used, for example.

Further, there is also a problem of a pumping phenomenon in the D amplifier circuit as described above. The pumping phenomenon mentioned here refers to a phenomenon in which the instability of power supply voltage is brought for some cause in a wide sense. More specifically, the instability of power supply voltage is brought because of a response delay of the coil forming a part of the low-pass filter mentioned above (further specifically, for example, a change delay (in the direction) of current relative to voltage change responsive to switching of two switching elements making up the half bridge from one to the other) or the like.

SUMMARY

It is an object of the invention to provide a class D amplifier circuit capable of solving at least some of the problems described above.

In order to achieve the above object, according to the present invention, there is provided a class D amplifier circuit for generating a pulse signal whose pulse width is modulated in response to an input signal, the class D amplifier circuit comprising:

a first switching element having a first end set to a power supply potential and a second end electrically connected to a first node;

a second switching element having a first end set to a reference potential and a second end electrically connected to the first node;

a third switching element having a first end electrically connected to a second node and a second end set to the reference potential;

a first capacitance element having first and second electrodes electrically connected to the first and second nodes respectively;

a fourth switching element having a first end electrically connected to the first node and a second end electrically connected to an output end;

a fifth switching element having a first end electrically connected to the second node and a second end electrically connected to the output end; and a control section that controls transition between a conduction state and a non-conduction state of each of the first to fifth switching elements to control a current direction flowing into a load having a first end electrically connected to the output end and a second end set to the reference potential, so that the current flows from the first end of the load to the second end of the load at a first timing and the current flows from the second end of the load to the first end of the load at a second timing.

Preferably, the control section controls the transition between the conduction state and the non-conduction state of each of the first to fifth switching elements so as to:

bring the first and third switching elements into the conduction state and bring other switching elements into the non-conduction state to charge the first capacitance element, at the first timing, bring the third and fourth switching elements into the conduction state and bring other switching elements into the non-conduction state to flow the current depending on the charge of the first capacitance element into the load, and at the second timing, bring the second and fifth switching elements into the conduction state and bring other switching elements into the non-conduction state to flow the current depending on the charge of the first capacitance element into the load.

Preferably, the class D amplifier circuit further comprises: a sixth switching element having a first end electrically connected to the second node; and a second capacitance element having a first electrode electrically connected to a second end of the sixth switching element and a second electrode set to the reference potential.

Preferably, the control section brings the second switching element and the sixth switching element into the conduction state and brings other switching elements into the non-conduction state to charge the second capacitance element.

Preferably, the class D amplifier circuit, further comprises: an output standby switching element having a first end electrically connected to the output end, a second end set to the reference potential, and a back gate connected to the first electrode of the second capacitance element or set to the power supply potential.

Preferably, the control section waits for output to the load by:

bringing the third switching element and the output standby switching element into the conduction state and bringing other switching elements into the non-conduction state before or after the first timing in a state that the first capacitance element is charged, and bringing the second switching element and the output standby switching element into the conduction state and bringing other switching elements into the non-conduction state before or after the second timing in a state that the first capacitance element is charged.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

An embodiment of the invention will be discussed below with reference to FIGS. 1 and 2. In the accompanying drawings as well as FIGS. 1 and 2, the ratio of the dimensions of each part may be made different from the actual ratio where appropriate.

Figure 1:
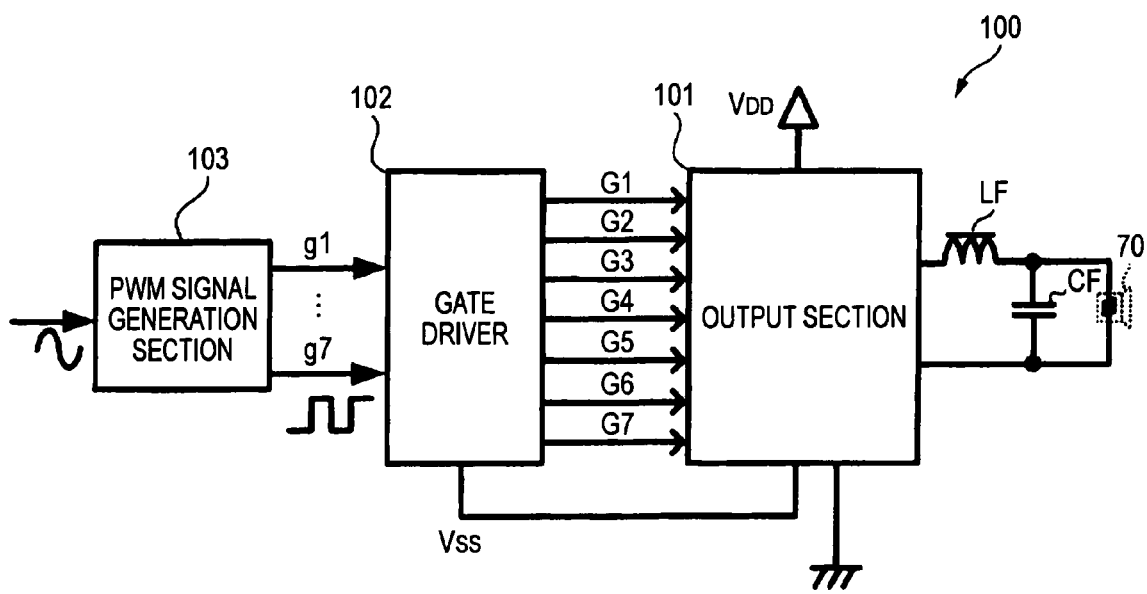
FIG. 1 is a block diagram to show the configuration of a class D amplifier circuit according to an embodiment of the invention.

A class D amplifier circuit 100 includes an output section 101, a gate driver 102, and a PWM (Pulse Width Modulation) signal generation section 103, as shown in FIG. 1.

The PWM signal generation section 103 generates a pulse signal having a pulse width responsive to an input signal. The gate driver 102 supplies a gate control signal to place each of gates of various transistors contained in the output section 101 at a predetermined potential in response to the pulse signal. The gate driver 102 may contain various circuits such as a level shifter (not shown) for raising or moving down the level of the gate control signal as required.

Various generation methods of the above-mentioned pulse signal or gate control signal are available and accordingly various specific configurations of the PWM signal generation section 103 and the gate driver 102 can exist. Basically, the invention does not pay special attention to the configurations of the PWM signal generation section 103 and the gate driver 102 or the signal generation methods by them.

Figure 2:
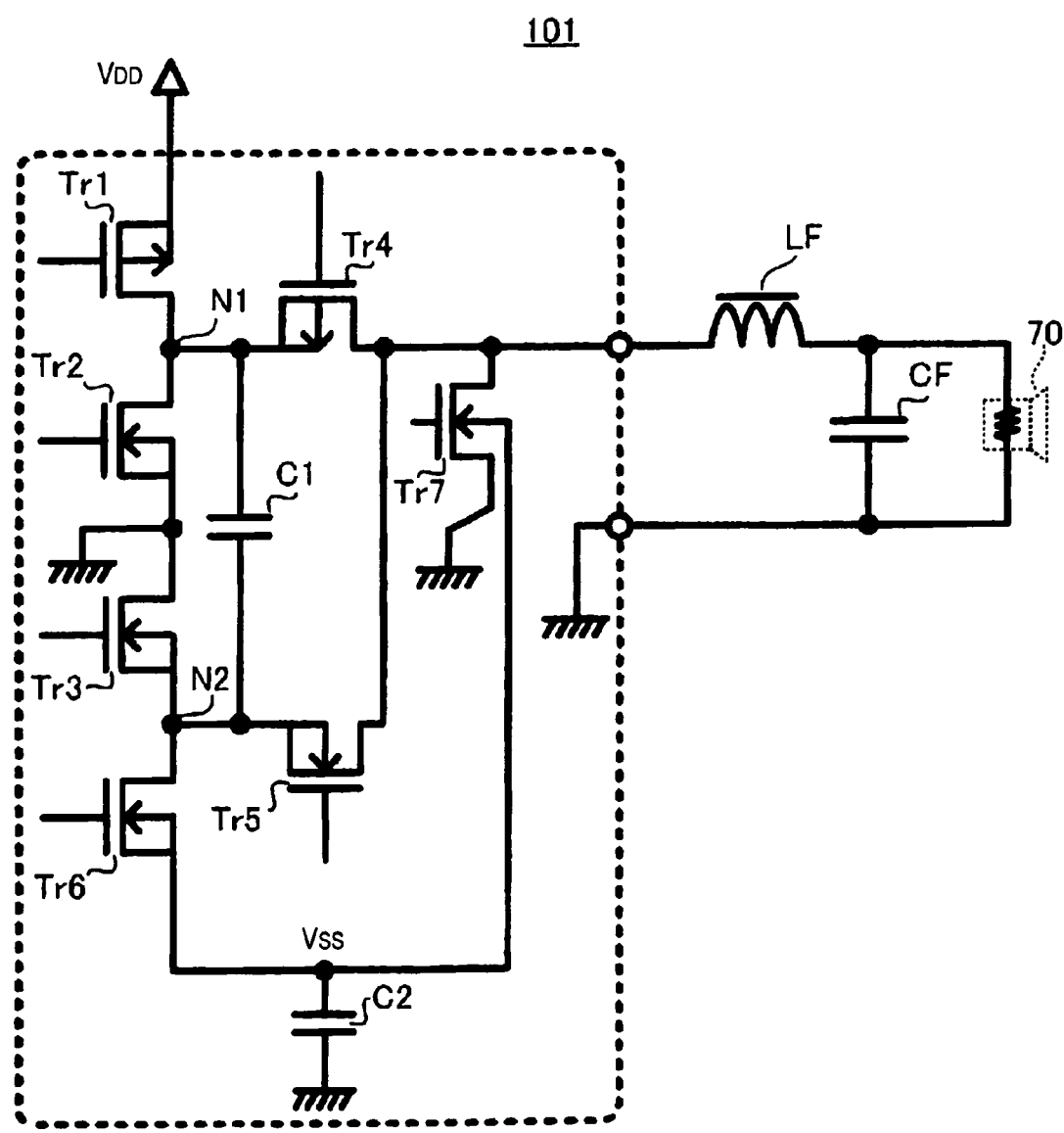
FIG. 2 is a circuit diagram to show the configuration of an output section (101) in FIG. 1.

The output section 101 has various circuit elements of various transistors, etc., as shown in FIG. 2. The output section 101 drives a load 70 based on the configuration made up of the various circuit elements and the input mode of the gate control signal described above.

In the embodiment, a low-pass filter made up of a capacitor CF and a coil LF is added to the load 70. In the embodiment, it should be noted that a capacitor from preventing a DC current from flowing into the load 70 is not added (this point is described later).

The output section 101 has first to seventh transistors Tr1 to Tr7 and first and second capacitors C1 and C2, as shown in FIG. 2. Each of the first to seventh transistors Tr1 to Tr7 is MOSFET (metal oxide semiconductor FET), for example.

The first transistor Tr1 has a source set to power supply potential VDD and a drain electrically connected to a first node N1. The first transistor Tr1 is a p-type transistor.

The second transistor Tr2 has a source set to reference potential GND and a drain electrically connected to the first node N1. Further, the third transistor Tr3 has a source electrically connected to a second node N2 and a drain set to the reference potential GND. Each of the second and third transistors is an n-type transistor.

The power supply potential VDD and the reference potential GND are set so that VDD>GND. In the embodiment, it should be noted that only one power supply of the output channel involved in driving the load 70 may be substantially provided (this point is described later).

The fourth transistor Tr4 has a source electrically connected to the first node N1. The fifth transistor Tr5 has a source electrically connected to the second node N2. Drains of the fourth and fifth transistors Tr4 and Tr5 form an output terminal of the output section 101 (to the load 70) and are electrically connected to one end of the coil LF. The fourth transistor Tr4 is a p-type transistor and the fifth transistor Tr5 is an n-type transistor.

The first capacitor C1 has first and second electrodes electrically connected to the first and second nodes N1 and N2. The first capacitor C1 functions as a power supply to the load 70 in the embodiment as it become obvious from the operation description given later.

In addition, the sixth transistor Tr6 has a drain electrically connected to the second node N2. The second capacitor C2 has one electrode electrically connected to a source of the sixth transistor Tr6 and the other electrode set to the reference potential GND. The second capacitor C2 functions as negative power supply SS for the gate driver 102 (see FIG. 1) particularly in the embodiment. The sixth transistor Tr6 is an n-type transistor.

The seventh transistor Tr7 has a drain electrically connected to the output terminal mentioned above and has a source set to the reference potential GND. The seventh transistor Tr7 has a back gate electrically connected to the one electrode of the second capacitor C2. Accordingly, a bias voltage responsive to the charge amount of the second capacitor C2 is applied to the back gate of the seventh transistor Tr7.

The seventh transistor Tr7 corresponds to one specific example of "output standby switching element" mentioned in the invention. In this connection, the first to sixth transistors Tr1 to Tr6 mentioned in the embodiment correspond to specific examples of "first switching element" to "sixth switching element" mentioned in the invention respectively, and the first and second capacitors C1 and C2 correspond to specific examples of "first capacitative element" and "second capacitative element" respectively.

The transition between conduction state and non-conduction state of the first to seventh transistors Tr1 to Tr7 is responsive to the gate control signal described above. FIG. 1 shows how seven gate control signals G1 to G7 are output from the gate driver 102. These seven gate control signals G1 to G7 are supplied to gates of the corresponding first to seventh transistors Tr1 to Tr7, whereby the conduction state and the non-conduction state of each of the first to seventh transistors Tr1 to Tr7 are controlled individually.

Next, the function, the operation, and the advantages of the class D amplifier circuit 100 according to the embodiment described above will be discussed with reference to FIGS. 3 to 11 in addition to FIGS. 1 and 2. The embodiment is characterized particularly by the operation of the output section 101 in the class D amplifier circuit 100 shown in FIG. 1 and therefore the description is given with emphasis on this point.

To begin with, in the class D amplifier circuit 100 according to the embodiment, the PWM signal generation section 103 generates a pulse signal having a pulse width responsive to an input signal, and the gate driver 102 generates a gate control signal in response to the pulse signal. As previously described, the invention does not pay special attention to specific generation methods of the various signals, etc. However, previously the generation order of the gate control signals G1 to G7 and the like according to the embodiment are limited as described below:

The generation order of the gate control signals G1 to G7 and the like (namely, the order of the transition between the conduction state and the non-conduction state of the first to seventh transistors Tr1 to Tr7 and the like) will be discussed. As the premise, how the class D amplifier circuit 100 according to the embodiment drives the load 70 will be roughly discussed below:

First, in the embodiment, the load 70 is driven so that two types of currents in the positive direction and the negative direction are allowed to flow into the load 70. Second, in the embodiment, to realize such driving, the steps of [i] charging step to [vi] negative output step described below are performed in an appropriate order. A brief example is as follows: [i] charging to [ii] negative power supply charging to [iii] positive output standby to [iv] positive output to [iii] positive output standby (up to here, "relevant to positive output"), [i] charging to [ii] negative power supply charging to [v] negative output standby to [vi] negative output to [v] negative output standby (up to here, "relevant to negative output"), to [i] charging to . . . (repeated), etc.

Figure 3:
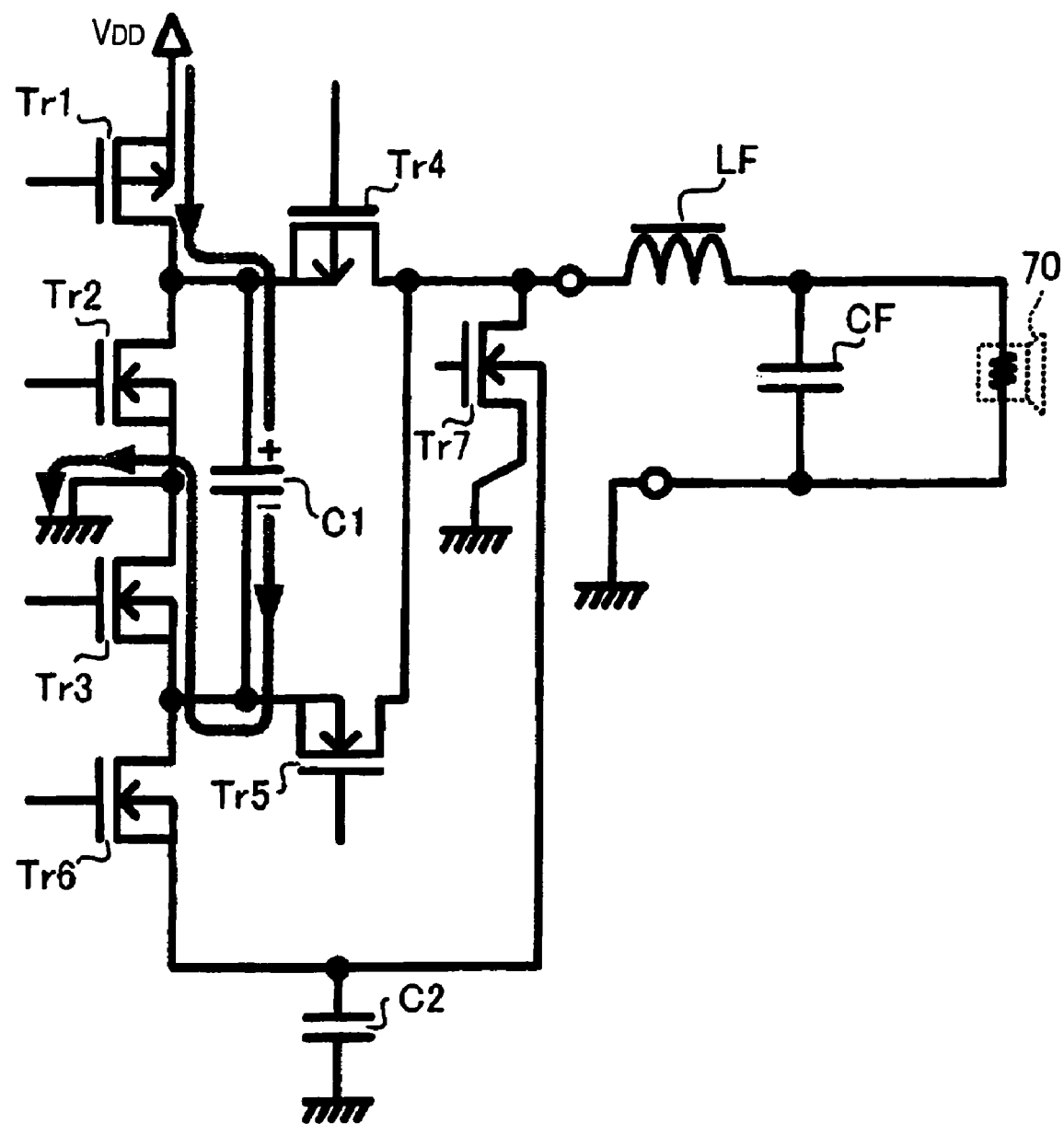
FIG. 3 is a schematic representation to show the state of each transistor, etc., when [i] charging step is executed in the output section in FIG. 2.

Based on the premise described above, the steps of [i] to [vi] will be discussed below:

[i] Charging Step (see FIG. 3);

The gate driver 102 generates gate control signals G1, G3, and G7 so as to bring the first, third, and seventh transistors Tr1, Tr3, and Tr7 into conduction state. At the same time, the gate driver 102 generates gate control signals G2 and G4 to G6 so as to bring other transistors (Tr2 and Tr4 to Tr6) into non-conduction state.

Accordingly, in the output section 101, as shown in FIG. 3, the upper electrode of the first capacitor C1 in the figure is set to the power supply potential VDD through the first transistor Tr1, and the lower electrode in the figure is set to the reference potential GND through the third transistor Tr3. Therefore, a current flows in the arrow direction shown in the figure around the first capacitor C1, a charge is accumulated between the electrodes of the first capacitor C1, and the upper side in the figure becomes plus side and the lower side becomes minus side.

As described above, charging of the first capacitor C1 responsive to the difference between the power supply potential VDD and the reference potential GND is performed. The seventh transistor Tr7 is in the conduction state and thus the reference potential GND is set across the load 70 and the state of the load 70 is fixed.

Figure 4:
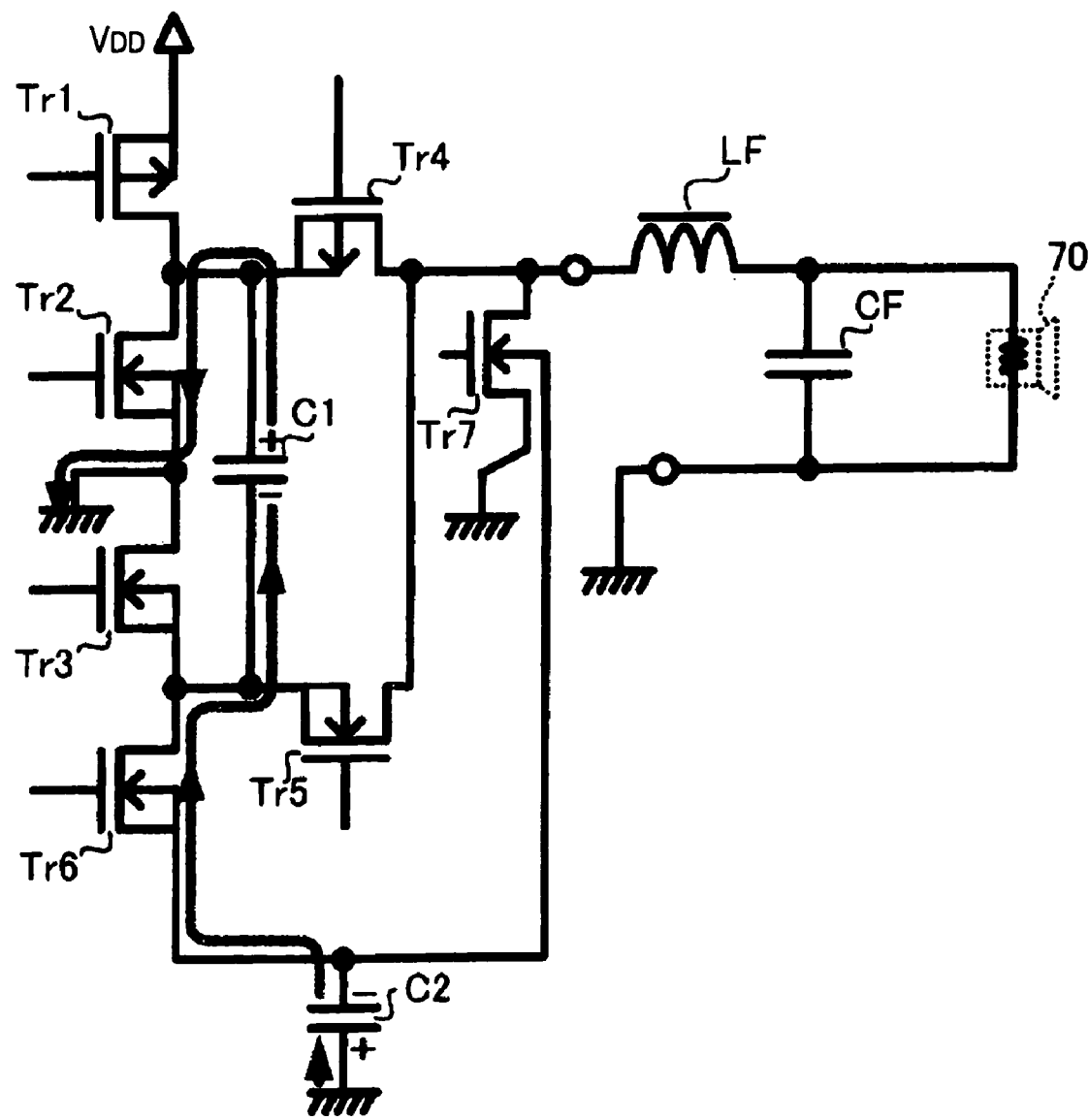
FIG. 4 is a schematic representation to show the state of each transistor, etc., when [ii] negative power supply charging step is executed in the output section in FIG. 2.

[ii] Negative Power Supply Charging Step (see FIG. 4);

The gate driver 102 generates gate control signals G2, G6, and G7 so as to bring the second, sixth, and seventh transistors Tr2, Tr6, and Tr7 into conduction state. At the same time, the gate driver 102 generates gate control signals G1 and G3 to G5 so as to bring other transistors (Tr1 and Tr3 to Tr5) into non-conduction state.

Accordingly, in the output section 101, as shown in FIG. 4, the upper electrode of the second capacitor C2 in the figure is brought into conduction state with the lower electrode of the first capacitor C1 in the figure through the sixth transistor Tr6. The upper electrode of the first capacitor C1 in the figure is set to the reference potential GND as the second transistor Tr2 conducts.

As described above, the second capacitor C2 is charged in response to the charge amount of the first capacitor C1. The seventh transistor Tr7 is in the conduction state and thus the reference potential GND is set across the load 70 and the state is fixed (this point is the same as [i] charging step).

Figure 5:
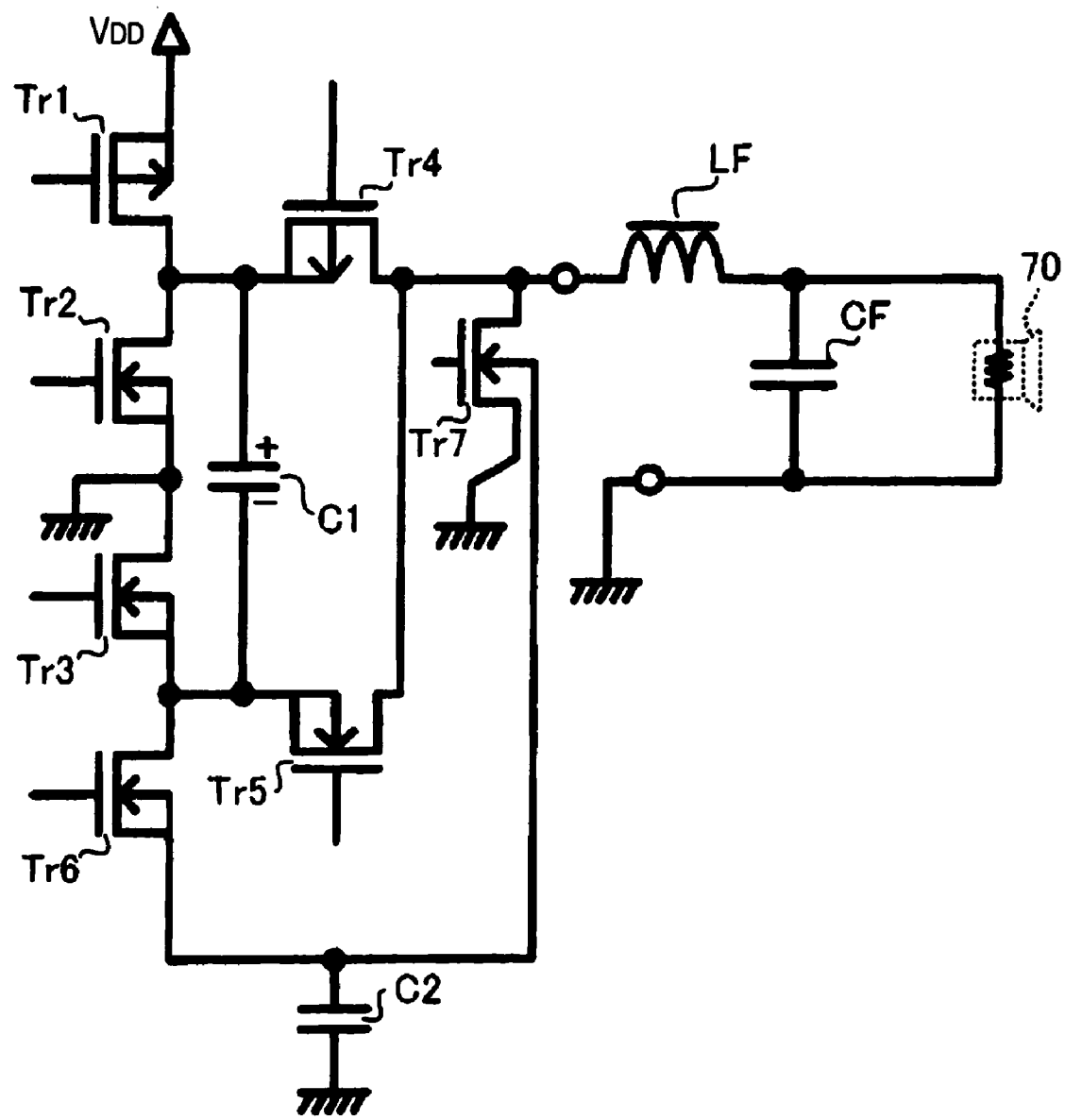
FIG. 5 is a schematic representation to show the state of each transistor, etc., when [iii] positive output standby step is executed in the output section in FIG. 2.

[iii] Positive Output Standby Step (see FIG. 5);

The gate driver 102 generates gate control signals G3 and G7 so as to bring the third and seventh transistors Tr3 and Tr7 into conduction state. At the same time, the gate driver 102 generates gate control signals G1, G2, and G4 to G6 so as to bring other transistors (Tr1, Tr2, and Tr4 to Tr6) into non-conduction state.

When [iii] positive output standby step is executed after [i] charging step, the first, second, and fourth transistors Tr1, Tr2, and Tr4 are brought into the non-conduction state and thus the charge accumulated between the electrodes of the first capacitor C1 is held. On the other hand, when [iii] positive output standby step is executed after [iv] positive output step described later, the step has the significance of preparing for execution of the next [i] charging step after the lower electrode of the first capacitor C1 in the figure is set to the reference potential GND.

In either case, the seventh transistor Tr7 is in the conduction state and thus the reference potential GND is set across the load 70 and the state is fixed (this point is the same as [i] charging step).

Figure 6:
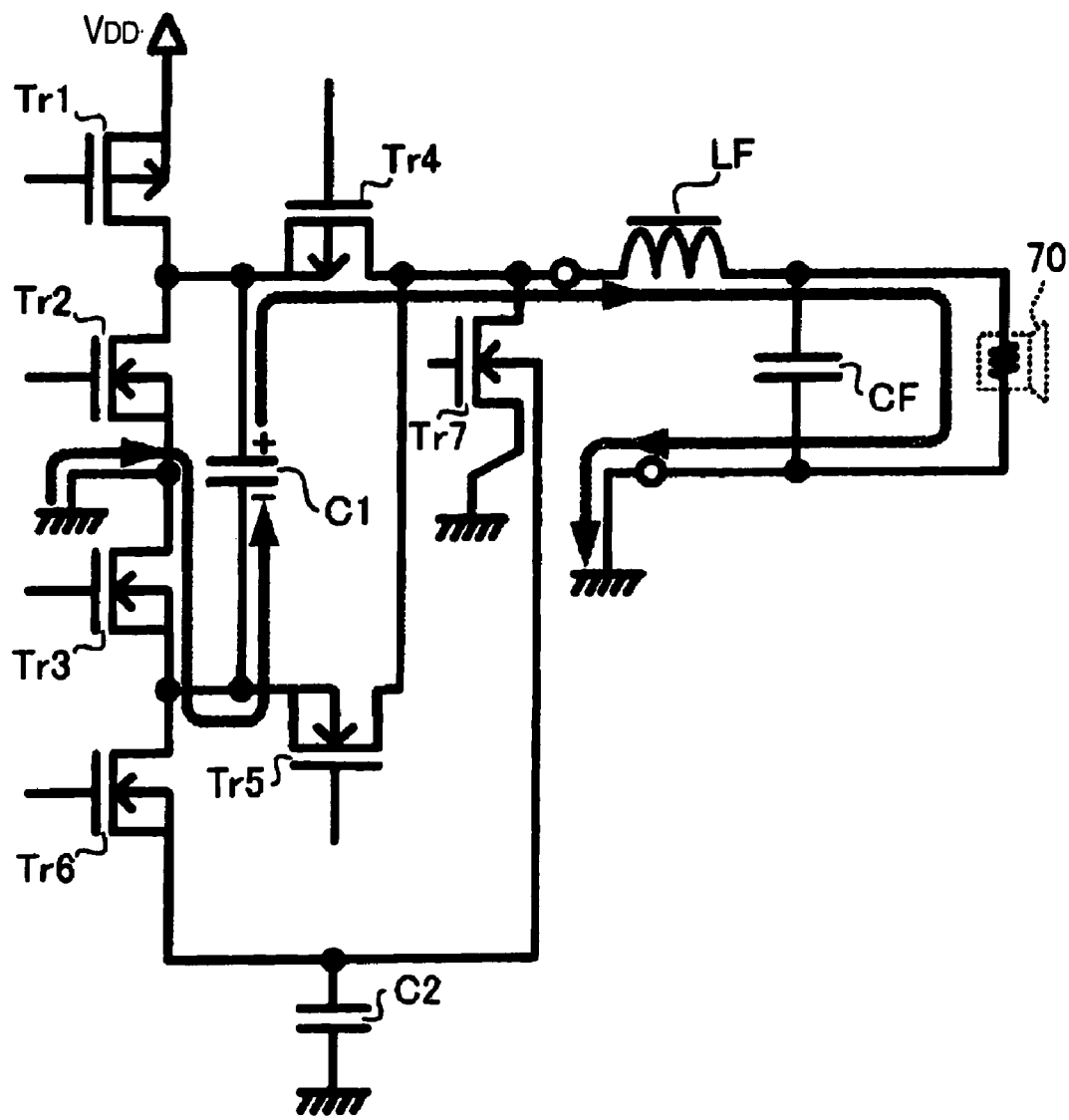
FIG. 6 is a schematic representation to show the state of each transistor, etc., when [iv] positive output step is executed in the output section in FIG. 2.

[iv] Positive Output Step (see FIG. 6);

The gate driver 102 generates gate control signals G3 and G4 so as to bring the third and fourth transistors Tr3 and Tr4 into conduction state. At the same time, the gate driver 102 generates gate control signals G1, G2, and G5 to G7 so as to bring other transistors (Tr1, Tr2, and Tr5 to Tr7) into non-conduction state.

Accordingly, in the output section 101, the upper electrode of the first capacitor C1 in the figure and one end of the load 70 are brought into conduction state, the lower electrode of the first capacitor C1 in the figure is brought into conduction state with the reference potential GND, and a current from the upper side to the lower side in the figure flows into the load 70.

As described above, the load 70 is driven by the current caused to occur by the charge stored in the first capacitor C1. In this meaning, in the embodiment, the first capacitor C1 functions as power supply to the load 70.

Figure 7:
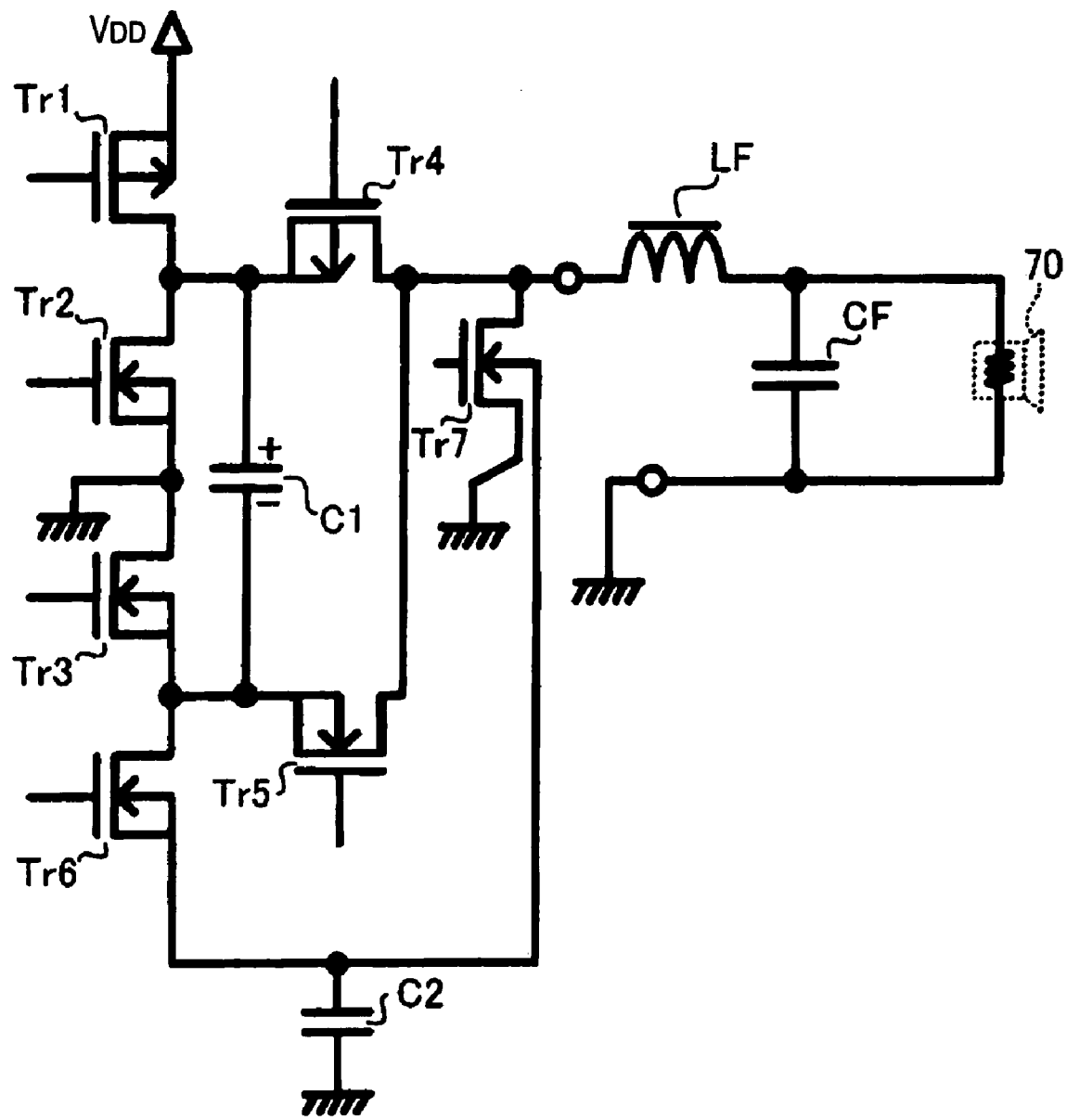
FIG. 7 is a schematic representation to show the state of each transistor, etc., when [v] negative output standby step is executed in the output section in FIG. 2.

[v] Negative Output Standby Step (see FIG. 7);

The gate driver 102 generates gate control signals G2 and G7 so as to bring the second and seventh transistors Tr2 and Tr7 into conduction state. At the same time, the gate driver 102 generates gate control signals G1 and G3 to G6 so as to bring other transistors (Tr1 and Tr3 to Tr6) into non-conduction state.

When [v] negative output standby step is executed after [i] charging step, the third, fifth, and sixth transistors Tr3, Try, and Tr6 are brought into the non-conduction state and thus the charge accumulated between the electrodes of the first capacitor C1 is held. On the other hand, when [v] negative output standby step is executed after [vi] negative output step described later, the step has the significance of preparing for execution of the next [i] charging step after the upper electrode of the first capacitor C1 in the figure is set to the reference potential GND.

In either case, the seventh transistor Tr7 is in the conduction state and thus the reference potential GND is set across the load 70 and the state is fixed (this point is the same as [i] charging step).

Figure 8:
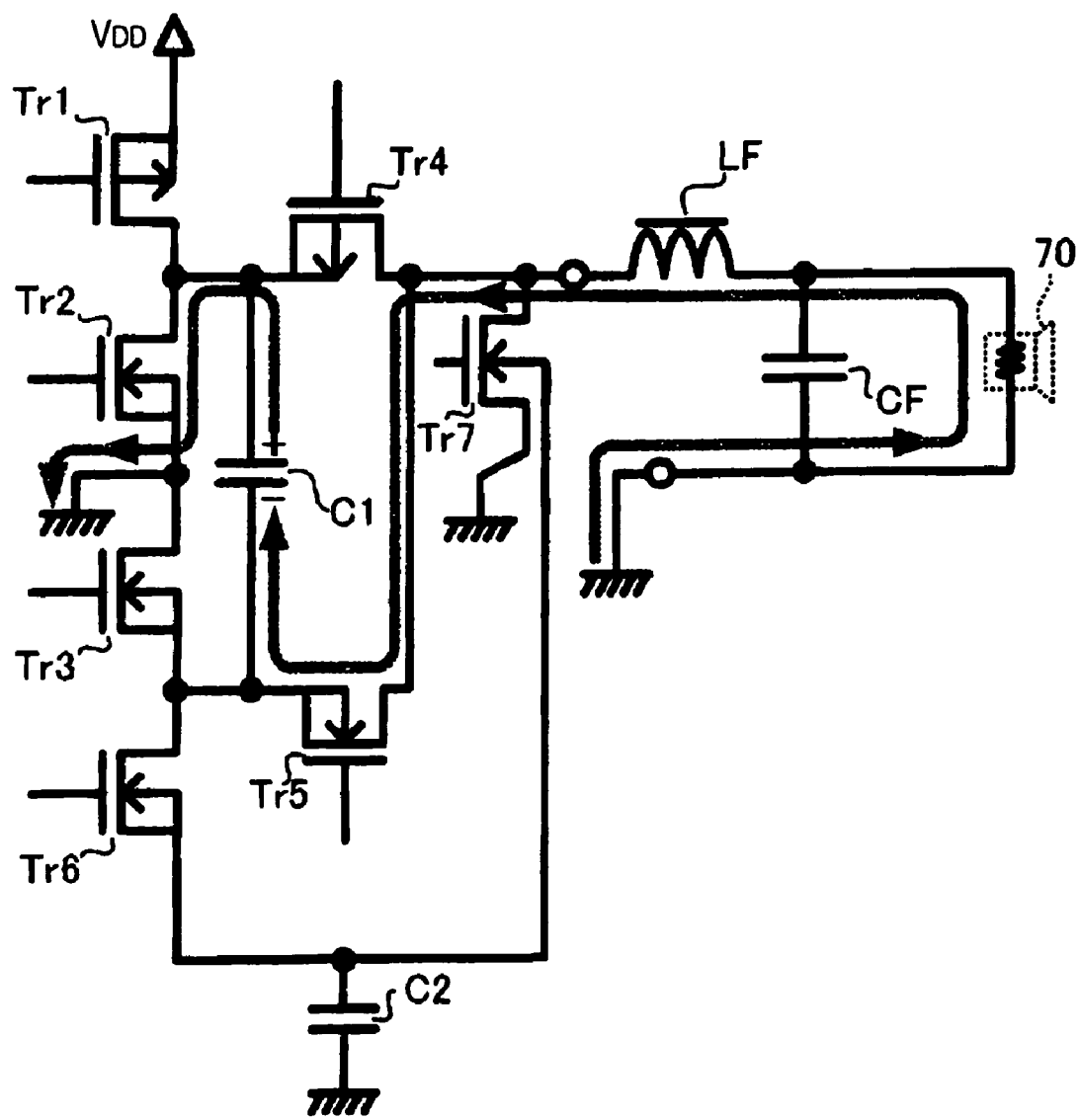
FIG. 8 is a schematic representation to show the state of each transistor, etc., when [vi] negative output step is executed in the output section in FIG. 2.

[vi] Negative Output Step (see FIG. 8);

The gate driver 102 generates gate control signals G2 and G5 so as to bring the second and fifth transistors Tr2 and Tr5 into conduction state. At the same time, the gate driver 102 generates gate control signals G1, G3, G4, G6, and G7 so as to bring other transistors (Tr1, Tr3, Tr4, Tr6, and Tr7) into non-conduction state.

Accordingly, in the output section 101, the lower electrode of the first capacitor C1 in the figure and one end of the load 70 are brought into conduction state, the upper electrode of the first capacitor C1 in the figure is brought into conduction state with the reference potential GND, and a current from the lower side to the upper side in the figure flows into the load 70.

As described above, the load 70 is driven by the current caused to occur by the charge stored in the first capacitor C1. In this meaning, the first capacitor C1 in the embodiment functions as power supply to the load 70 also containing the case of [iv] positive output step described above.

It is important that the direction of the current flowing into the load 70 becomes opposite between [iv] positive output step and [vi] negative output step described above.

The steps described above are executed according to the appropriate order in response to those relevant to positive output and those relevant to negative output separately in such a manner that steps relevant to positive output: FIG. 3 to FIG. 4 to FIG. 5 to FIG. 6 to FIG. 5 to (FIG. 3)

steps relevant to negative output: FIG. 3 to FIG. 4 to FIG. 7 to FIG. 8 to FIG. 7 to (FIG. 3).

Figure 9:
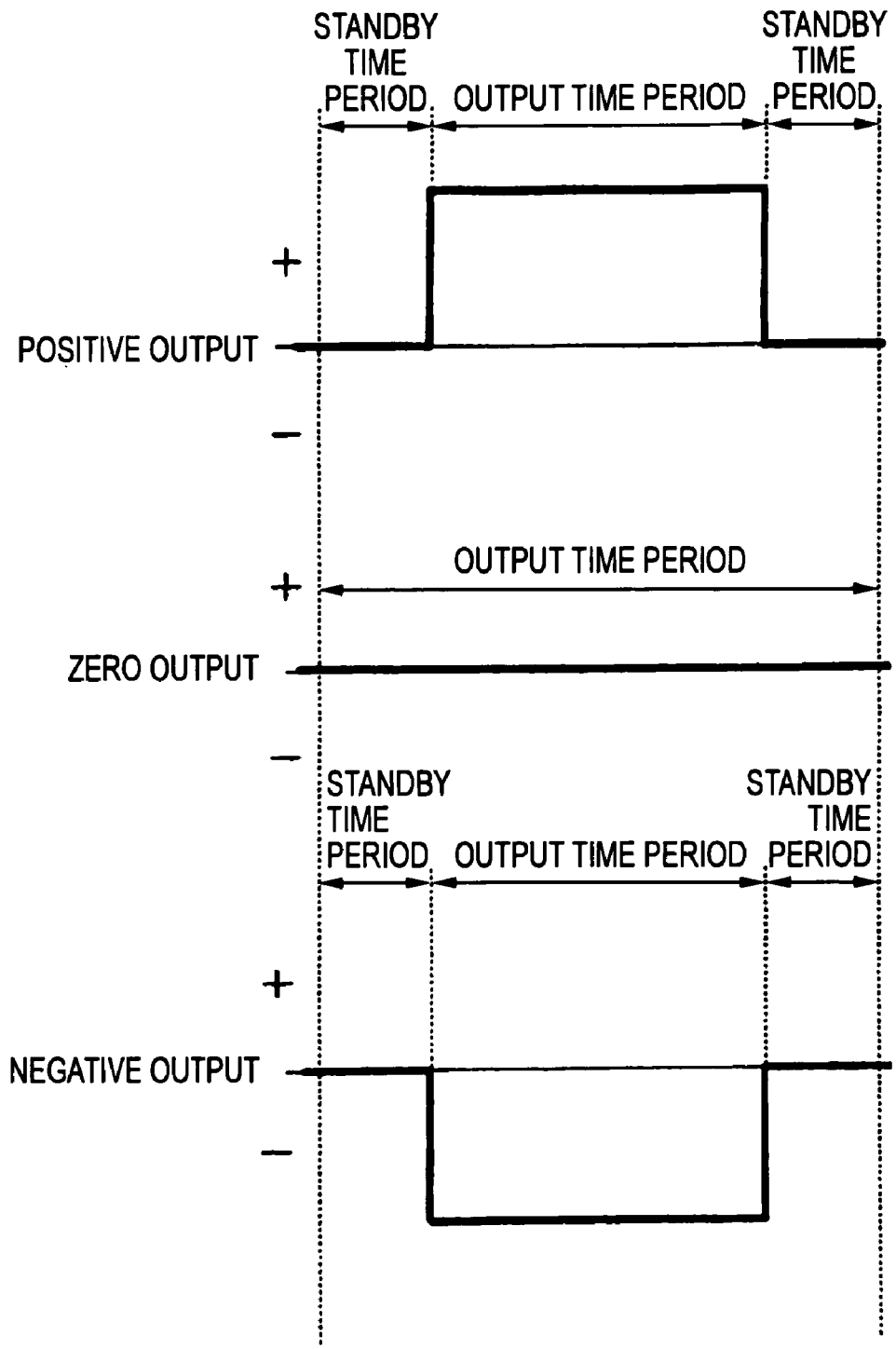
FIG. 9 is a schematic representation to show how pulses are output as a result of FIGS. 3 to 8.

Accordingly, positive output and negative output involving a standby time period are performed as shown in FIG. 9. In this connection, in the embodiment, to perform zero output, a standby time period is set, whereby output of the output section 101 is set to 0 (see FIG. 9).

If the "steps relevant to positive output" and the "steps relevant to negative output" are grasped each as one process, it can be the that [i] charging step (FIG. 3) and [ii] negative power supply charging step (FIG. 4) are preparation steps in a wide sense and thus it is assumed that the steps are performed in a relatively short time as compared with other steps; specifically, for example, the execution time of [i] and [ii] occupies one eighth of the whole time period of the process and the execution time of other steps occupies seven eighths of the whole time period or the like. As a specific numeric value, the actual time during which other steps are executed can be set to 2 µs, etc., for example. In this case, the output time period shown in FIG. 9, namely, the time period during which the first capacitor C1 and the load 70 are connected is 2 µs at the maximum. Assuming that the capacitance value of the first capacitor C1 is 1 µF and the resistance of the load 70 is 16 Ω, the voltage lowers only 12%. That is, if a capacitor having a comparatively small capacitance value is provided as the first capacitor C1, all charge loss of the capacitor does not occur.

When the steps of [i] to [vi] as described above are repeated, preferably a buffer time period of a proper duration between the steps. The buffer time period means a time period to avoid a situation in which a transistor brought into a conduction state in each of any two consecutive steps is brought into the conduction state at the same time. For example, in [i] charging step and [ii] negative power supply charging step, the first transistor Tr1 is turned on (conduction) in the former and is turned off (non-conduction) in the latter; the second transistor Tr2 is turned off (non-conduction) in the former and is turned on (conduction) in the latter. In this case, as execution of both steps overlaps on the time basis, if the first and second transistors Tr1 and Tr2 are both turned on, a through current piercing both occurs; preferably such a situation is avoided. Then, in such a case, it is desirable that a state in which the first and second transistors Tr1 and Tr2 are both turned off should be provided even in a slight time period. The buffer time period is a time to realize such a situation.

To provide the buffer time period, the percentage of each of the steps occupying the whole time period of the process should be determined in response to the buffer time period.

The class D amplifier circuit 100 having the configuration and the function as described above provides the following advantages:

(1) First, the class D amplifier circuit 100 of the embodiment eliminates the need for installing a capacitor to prevent a DC current from flowing into a load as described in the related art example. According to the embodiment, although positive and negative two power supplies are not provided, the load 70 can be driven by two types of currents flowing in the positive direction and the negative direction. This point can be understood more obviously with FIGS. 10 and 11.

Figure 10:
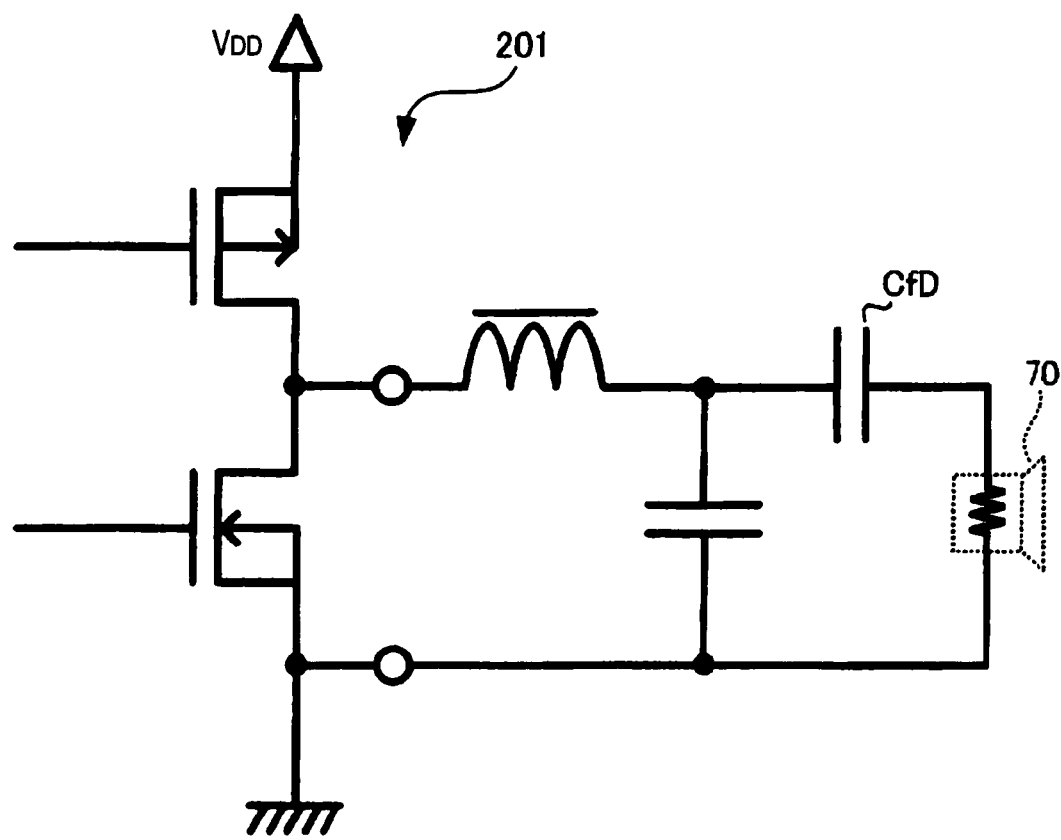
FIG. 10 is a circuit diagram to show the configuration of an output section (201) in a related example corresponding to FIG. 2.
Figure 11:
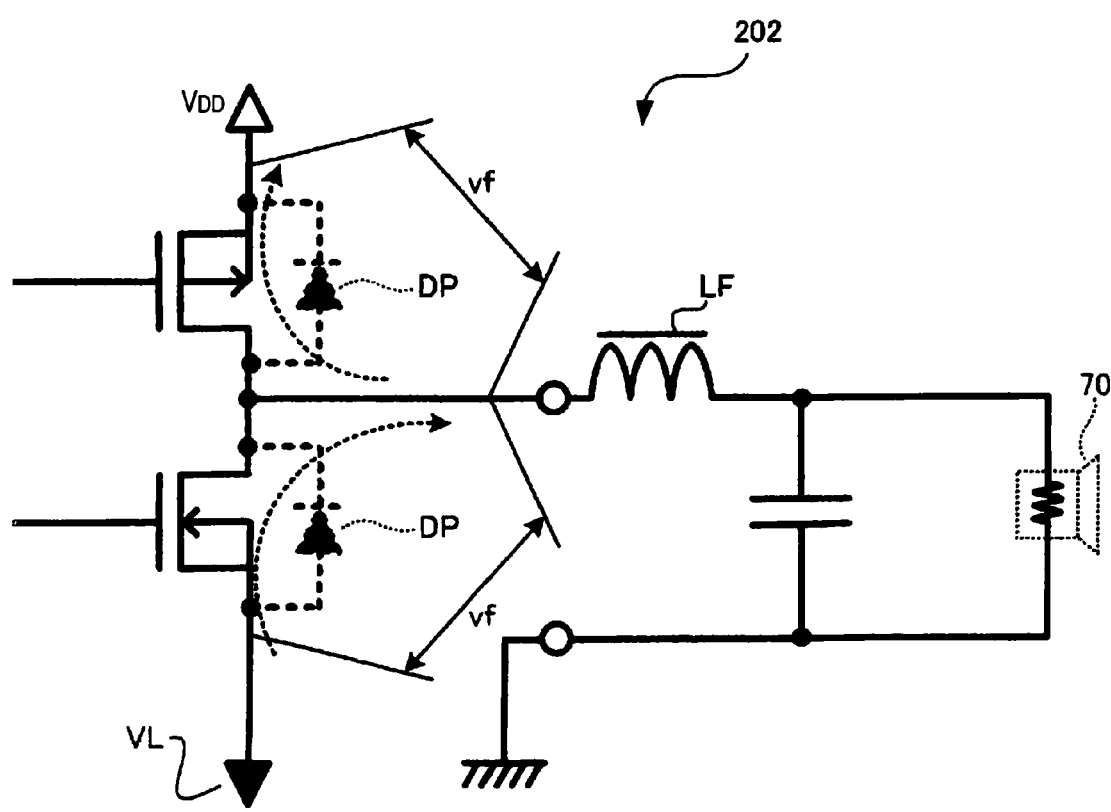
FIG. 11 is a circuit diagram to show the configuration of an output section (202) in a related example corresponding to FIG. 2.

FIGS. 10 and 11 show output sections 201 and 202 having configurations in conventional examples corresponding to the output section 101 according to the embodiment shown in FIG. 2. FIG. 10 represents that it is necessary to add a capacitor CfD to block a DC component for a load 70. On the other hand, in FIG. 11, a negative power supply VL eliminates the need for installing of the capacitor CfD shown in FIG. 10; in other words, the negative power supply VL must be provided additionally. However, it is higher feared that each of the capacitor CfD and the negative power supply VL may hinder miniaturization of the whole device or may result in complicating the circuit configuration, etc. (Symbol DP, etc., shown in FIG. 11 will be discussed later.)

In the embodiment, such a defect can be circumvented because the load 70 can be driven by two types of currents flowing in the positive direction and the negative direction without providing positive and negative two power supplies as previously described with reference to FIGS. 2 to 8, etc.

(2) In this connection, the class D amplifier circuit 100 of the embodiment can also be applied sufficiently to a load requiring the ground criterion, such as stereo headphone or stereo earphone, for example, since positive and negative two power supplies are not provided and currents in both the positive and negative directions are generated only with one type of power supply potential VDD and reference potential GND in the embodiment as described above. In this point, the class D amplifier circuit 100 of the embodiment has the advantage over a full bridge class D amplifier circuit.

(3) Further, the class D amplifier circuit 100 of the embodiment eliminates the need to worry about a pumping phenomenon as described above.

First, from a more general viewpoint, the pumping phenomenon will be discussed. A parasitic diode DP exists in each transistor as shown in FIG. 11 for reference. Accordingly, when the transistor is turned off (non-conduction), if a current flows into a coil LF, a current as indicated by the dashed-line arrow in FIG. 11 flows and a potential difference of responsive to this occurs. The current flowing direction is a direction in which power supply is charged about each of the two transistors shown in FIG. 11 and thus it is feared that the power supply voltage may become unstable.

In the class D amplifier circuit 100 of the embodiment, particularly in the output section 101, the first capacitor C1 functions as the power supply to the load 70 and thus the effect of the current on it is considered; from the viewpoint, there is scarcely worrying about the pumping phenomenon as described above in the embodiment.

First, assuming that the seventh transistor Tr7 is turned on (conduction), the capacitor CF and the coil LF making up the low-pass filter including the load 70 are placed in a fixed state and the current flowing into the coil LF flows toward the reference potential GND or flows with it as the start point and thus no pumping phenomenon occurs (see FIGS. 3, 4, 5, and 7).

Second, assuming that the seventh transistor Tr7 is turned off (non-conduction) (see FIGS. 5 and 7) and that the direction of the current flowing into the coil LF matches the current direction in an output state, there is a possibility that the above-mentioned potential difference of will occur as for the fifth transistor Tr5 in FIG. 5 or the fourth transistor Tr4 in FIG. 7, for example. In this case, however, the current flows toward the reference potential GND or flows with it as the start point and thus no pumping phenomenon occurs.

Third, assuming that the seventh transistor Tr7 is turned off (non-conduction) (see FIGS. 6 and 8) and that the direction of the current flowing into the coil LF is opposite to the current direction in an output state, there is a possibility that the current flows through the fourth transistor Tr4 in FIG. 6 or the fifth transistor Tr5 in FIG. 8, for example. In this case, the possibility that charging of the first capacitor C1 will be performed occurs. However, it is considered that the occurrence frequency of the third case is extremely low as compared with the occurrence frequency of each of the first and second cases, it is considered that generally the load current is small, and further it is considered that the continuation time of such a state is extremely short, etc., and thus the possibility of having an effect on the output is extremely small.

As described above, in the embodiment, there is no fear of the pumping phenomenon except for the third case and moreover, it is considered that the effect of the third case is extremely small. After all, the need to worry about the pumping phenomenon scarcely exists in the output section 101 according to the embodiment.

(4) The class D amplifier circuit 100 of the embodiment also has the advantage that the negative power supply for the gate driver 102 is provided in the second capacitor of the output section 101.

Further, according to the class D amplifier circuit 100 of the embodiment, the output standby state (the fixed state of the load 70) as previously described with reference to FIGS. 3, 4, 5, and 7 is preferably realized, so that there is no worrying about occurrence of fruitless noise, etc., for example.

While the embodiment according to the invention has been described, it is to be understood that the class D amplifier circuit 100 according to the invention is not limited to the specific embodiment described above and can be embodied in various modifications.

(1) In the embodiment described above, as shown in FIG. 2, the output section 101 includes the sixth transistor Tr6 and the second capacitor C2 and [ii] negative power supply charging step using these is performed, but the configuration and the step are not indispensable in the invention.

Likewise, in the embodiment described above, the output section 101 includes the seventh transistor Tr7 and [iii] positive output standby step and [v] negative output standby step using this are performed, but the configuration and the steps are not indispensable in the invention.

In short, the mode in which these elements and steps are omitted or further different elements and steps are added is also included in the scope of the invention.

The necessary minimum configuration that the invention requires is only the first to fifth transistors Tr1 to Tr5 and the first capacitor C1 except the elements mentioned above following FIG. 2. According to this, it is also obvious that the advantages provided by the embodiment described above can be enjoyed without changing the substantial portion.

(2) In the embodiment described above, the case where the three forms of positive output, negative output, and zero output are executed individually is kept in mind as previously described with reference to FIG. 9, but the invention is not limited to the mode.

Figure 12:
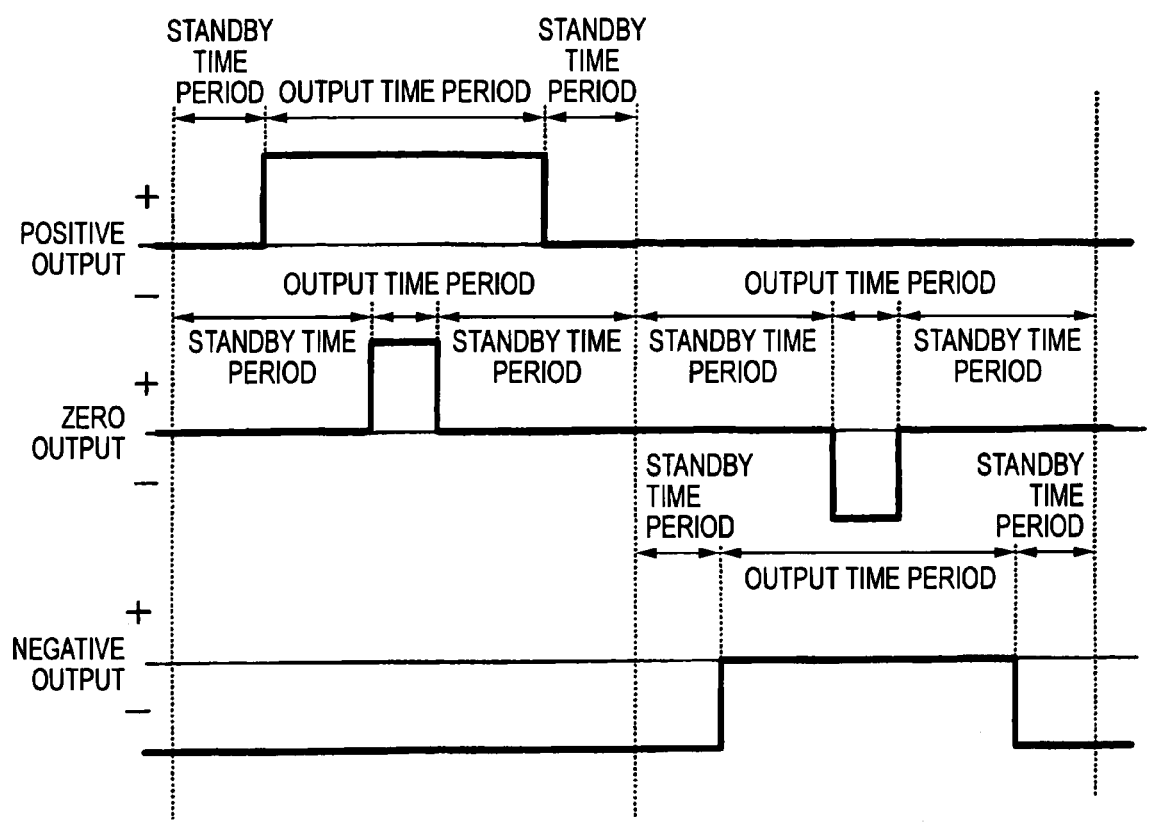
FIG. 12 shows an output pulse example of class D output (No. 1)
Figure 13:
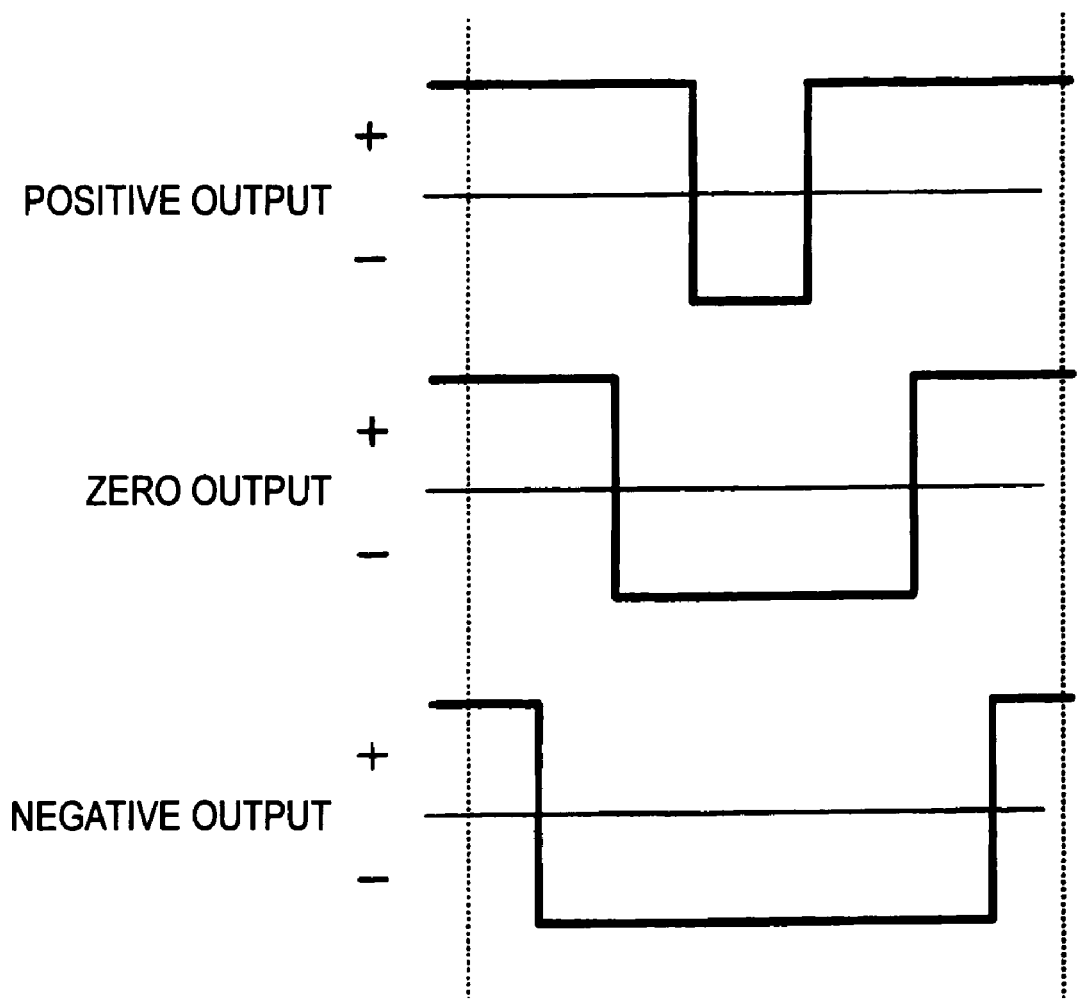
FIG. 13 shows an output pulse example of class D output (No. 2)

Generally, various class D output methods are available. For example, a method of leaving an output pulse when the input signal is zero is available as shown in FIG. 12 or a method of determining each output according to the difference in the ratio between high and low levels is also available as shown in FIG. 13 (in this case, for zero output, the high and low levels are placed in equal ratio therebetween).

Basically, the invention can be applied regardless of the output method. For example, in the case as shown in FIG. 12, it is obvious that the embodiment described above can be applied as it is without involving large change. Even in the case as in FIG. 13, if [i] charging step, etc., is executed at the timing at which the polarity level of an output pulse is switched, the invention can be applied sufficiently.

In any way, from such a viewpoint, the invention is not particularly limited.

(3) In the embodiment described above, the mode in which only one output system is provided has been described, but the invention is not limited to the mode.

Figure 14:
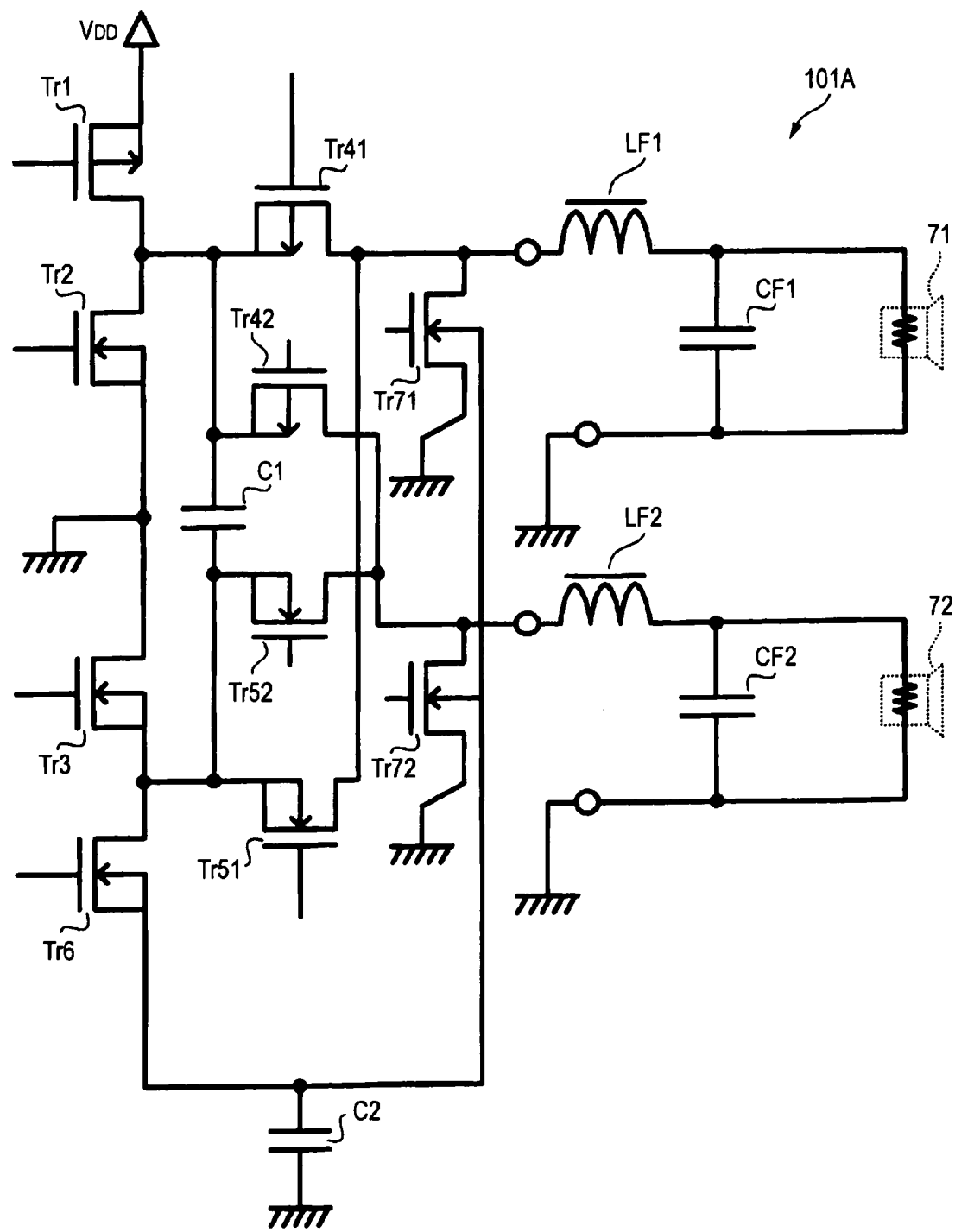
FIG. 14 is a drawing similar to FIG. 2 and is a circuit diagram to show the configuration of an output section (101A) according to another embodiment of the invention.

For example, two output systems may exist as shown in FIG. 14. An output section 101A in FIG. 14 is provided with a first low-pass filter made up of a capacitor CF1 and a coil LF1 corresponding to a first load 71 and a second low-pass filter made up of a capacitor CF2 and a coil LF2 corresponding to a second load 72. As for the fourth, fifth, and seventh transistors Tr4, Tr5, and Tr7 mentioned in the embodiment described above, each two are provided in FIG. 14 (see transistors Tr41 and Tr42, transistors Tr51 and Tr52, and transistors Tr71 and Tr72 in the figure). The remaining components are similar to those in FIG. 2 as seen in the figure.

According to the mode, it is also obvious that the advantages not substantially different from those provided by the embodiment described above are provided.

Here, the details of the above embodiments are summarized as follows.

A class D amplifier circuit for generating a pulse signal whose pulse width is modulated in response to an input signal, includes a first switching element having a first end set to a power supply potential and a second end electrically connected to a first node; a second switching element having a first end set to a reference potential and a second end electrically connected to the first node; a third switching element having a first end electrically connected to a second node and a second end set to the reference potential; a first capacitance element having first and second electrodes electrically connected to the first and second nodes respectively; a fourth switching element having a first end electrically connected to the first node and a second end electrically connected to an output end; a fifth switching element having a first end electrically connected to the second node and a second end electrically connected to the output end; and a control section that controls transition between a conduction state and a non-conduction state of each of the first to fifth switching elements to control a current direction flowing into a load having a first end electrically connected to the output end and a second end set to the reference potential, so that the current flows from the first end of the load to the second end of the load at a first timing and the current flows from the second end of the load to the first end of the load at a second timing.

According to the invention, the conduction state and the non-conduction state of each of various switching elements are properly controlled, whereby the first capacitance element is made to function as a power supply and both positive and negative outputs can be performed to the load. Thus, the invention eliminates the need for a capacitor to prevent a DC current from flowing into the load. Moreover, the invention makes it possible to enjoy the advantage without providing positive and negative two power supplies (conversely, the invention provides the advantage that positive and negative two power supplies need not be provided). Therefore, the class D amplifier circuit according to the invention can be preferably applied if the load requires the ground criterion.

In the invention, the expressions "first timing" and "second timing" (particularly, "first," "second") do not represent preceding and following relative to the time and are only simple names to discriminate between the timings.

In the class D amplifier circuit according to the invention, the control controls the transition between the conduction state and the non-conduction state of each of the first to fifth switching elements so as to: bring the first and third switching elements into the conduction state and bring other switching elements into the non-conduction state to charge the first capacitance element, at the first timing, bring the third and fourth switching elements into the conduction state and bring other switching elements into the non-conduction state to flow the current depending on the charge of the first capacitance element into the load, and at the second timing, bring the second and fifth switching elements into the conduction state and bring other switching elements into the non-conduction state to flow the current depending on the charge of the first capacitance element into the load.

According to the above configuration, the control section preferably controls the switching elements, so that the advantages of the invention can be provided more effectively.

The class D amplifier circuit may further include a sixth switching element having a first end electrically connected to the second node; and a second capacitance element having a first electrode electrically connected to a second end of the sixth switching element and a second electrode set to the reference potential.

According to the above configuration, the conduction state and the non-conduction state of each of the switching elements including the sixth switching element are properly controlled, whereby the second capacitance element is charged and can be made to function as a negative power supply. Such a negative power supply can be used as a power supply for driving the control section, for example. For example, if each of the switching elements is an FET (Field Effect Transistor), more specifically, the "control section" mentioned here has a "gate driver" for supplying a predetermined potential to the gate of each transistor or a "level shifter" contained in the gate driver, or the like.

The "second capacitance element" in the above configuration can be made to allow no current to flow into the load, in this case, a capacitance element having a smaller capacitance value than the first capacitance element is provided.

In the above configuration, the control section may bring the second switching element and the sixth switching element into the conduction state and bring other switching elements into the non-conduction state to charge the second capacitance element.

According to the above configuration, the advantage that the second capacitance element is used as a negative power supply can be provided more effectively.

The class D amplifier circuit may further include an output standby switching element having a first end electrically connected to the output end, a second end set to the reference potential, and a back gate connected to the first electrode of the second capacitance element or set to the power supply potential.

According to the above configuration, the output standby switching element is provided, so that output to the load is performed more preferably. Particularly, a parasitic diode does not occur between the output end and the reference potential and thus it is preferable. Also, it is assumed that if the back gate is connected to the first electrode of the second capacitance element, the "output standby switching element" is an "n-type transistor" and that if the back gate is connected to the power supply potential, the "output standby switching element" is a "p-type transistor."

In the above configuration, the control section, in a state that the first capacitance element is charged, before or after the first timing, may bring the third switching element and the output standby switching element into the conduction state and brings other switching elements into the non-conduction state, and in a state that the first capacitance element is charged, before or after the second timing, may bring the second switching element and the output standby switching element into the conduction state and brings other switching elements into the non-conduction state, thereby waiting for output to the load.

According to the above configuration, the advantage relating to realizing the standby state described above can be provided more effectively.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-058605 filed on Mar. 11, 2009, the contents of which are incorporated herein for reference.

What is claimed is:

1. A class D amplifier circuit for generating a pulse signal whose pulse width is modulated in response to an input signal, the class D amplifier circuit comprising:
   a first switching element having a first end set to a power supply potential and a second end electrically connected to a first node;
   a second switching element having a first end set to a reference potential and a second end electrically connected to the first node;
   a third switching element having a first end electrically connected to a second node and a second end set to the reference potential;
   a first capacitance element having first and second electrodes electrically connected to the first and second nodes respectively;
   a fourth switching element having a first end electrically connected to the first node and a second end electrically connected to an output end;
   a fifth switching element having a first end electrically connected to the second node and a second end electrically connected to the output end; and
   a control section that controls transition between a conduction state and a non-conduction state of each of the first to fifth switching elements to control a current direction flowing into a load having a first end electrically connected to the output end and a second end set to the reference potential, so that the current flows from the first end of the load to the second end of the load at a first timing and the current flows from the second end of the load to the first end of the load at a second timing.

2. The class D amplifier circuit according to claim 1, wherein the control section controls the transition between the conduction state and the non-conduction state of each of the first to fifth switching elements so as to:
   bring the first and third switching elements into the conduction state and bring other switching elements into the non-conduction state to charge the first capacitance element,
   at the first timing, bring the third and fourth switching elements into the conduction state and bring other switching elements into the non-conduction state to flow the current depending on the charge of the first capacitance element into the load, and
   at the second timing, bring the second and fifth switching elements into the conduction state and bring other switching elements into the non-conduction state to flow the current depending on the charge of the first capacitance element into the load.

3. The class D amplifier circuit according to claim 1, further comprising:
   a sixth switching element having a first end electrically connected to the second node; and
   a second capacitance element having a first electrode electrically connected to a second end of the sixth switching element and a second electrode set to the reference potential.

4. The class D amplifier circuit according to claim 3, wherein the control section brings the second switching element and the sixth switching element into the conduction state and brings other switching elements into the non-conduction state to charge the second capacitance element.

5. The class D amplifier circuit according to claim 3, further comprising:
   an output standby switching element having a first end electrically connected to the output end, a second end set to the reference potential, and a back gate connected to the first electrode of the second capacitance element or set to the power supply potential.

6. The class D amplifier circuit according to claim 5, wherein the control section waits for output to the load by:
   bringing the third switching element and the output standby switching element into the conduction state and bringing other switching elements into the non-conduction state before or after the first timing in a state that the first capacitance element is charged, and
   bringing the second switching element and the output standby switching element into the conduction state and bringing other switching elements into the non-conduction state before or after the second timing in a state that the first capacitance element is charged.

* * * * *